United States Patent
Kim et al.

(10) Patent No.: US 8,232,551 B2
(45) Date of Patent: Jul. 31, 2012

(54) CHANNEL LAYERS AND SEMICONDUCTOR DEVICES INCLUDING THE SAME

(75) Inventors: Sun-il Kim, Yongin-si (KR); I-hun Song, Seongnam-si (KR); Chang-jung Kim, Yongin-si (KR); Jae-chul Park, Seoul (KR); Sang-wook Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 265 days.

(21) Appl. No.: 12/458,491

(22) Filed: Jul. 14, 2009

(65) Prior Publication Data
US 2010/0006834 A1 Jan. 14, 2010

(30) Foreign Application Priority Data

Jul. 14, 2008 (KR) .................. 10-2008-0068344
Apr. 17, 2009 (KR) .................. 10-2009-0033846

(51) Int. Cl.
H01L 29/26 (2006.01)
(52) U.S. Cl. .................. 257/43; 257/E29.273
(58) Field of Classification Search .................. 257/27, 257/43, 57, 63, 59, 72, 343, 613, 347, 348, 257/E29.053, E29.117, E29.273, 404, E27.112
See application file for complete search history.

(56) References Cited

U.S. PATENT DOCUMENTS

2005/0017302 A1* 1/2005 Hoffman .................. 257/347
2007/0063211 A1 3/2007 Iwasaki

FOREIGN PATENT DOCUMENTS

| EP | 2 061 086 | 5/2009 |
|----|-----------|--------|
| JP | 2005-150635 | 6/2005 |
| JP | 2007-096126 | 4/2007 |
| JP | 2007-194594 | 8/2007 |
| JP | 2007-220820 | 8/2007 |
| KR | 10-2007-0122517 | 12/2007 |
| WO | WO 2005/074038 | 11/2005 |

OTHER PUBLICATIONS

European Search Report dated Oct. 6, 2009.
Office Action issued May 17, 2011, in corresponding European Patent Application No. 09 165 080.4.

* cited by examiner

*Primary Examiner* — Victor A Mandala
*Assistant Examiner* — Selim Ahmed
(74) *Attorney, Agent, or Firm* — Harness, Dickey & Pierce, P.L.C.

(57) ABSTRACT

Channel layers and semiconductor devices including the channel layers are disclosed. A channel layer may include a multi-layered structure. Layers forming the channel layer may have different carrier mobilities and/or carrier densities. The channel layer may have a double layered structure including a first layer and a second layer which may be formed of different oxides. Characteristics of the transistor may vary according to materials used to form the channel layers and/or thicknesses thereof.

17 Claims, 11 Drawing Sheets

CHANNEL LAYERS AND SEMICONDUCTOR DEVICES INCLUDING THE SAME

CROSS-REFERENCE TO RELATED APPLICATIONS

This application claims priority under 35 U.S.C. §119 to Korean Patent Applications Nos. 10-2008-0068344 and 10-2009-0033846, filed on Jul. 14, 2008 and Apr. 17, 2009, in the Korean Intellectual Property Office (KIPO), the entire contents of which is incorporated herein reference.

BACKGROUND

1. Field

Example embodiments relate to semiconductor devices, and more particularly, to channel layers and semiconductor devices including the same.

2. Description of the Related Art

Transistors are commonly used as switching or driving elements in electronic devices. For example, a thin film transistor (TFT) is a type of transistor that can be formed on a glass or plastic substrate and is often used to switch and/or drive flat panel display apparatuses (e.g., liquid crystal displays and organic light emitting displays).

In order to improve the operational characteristics of transistors, attempts have been made to utilize oxide semiconductors as the transistor channel layer (e.g., a conventional oxide transistor). This conventional method is mainly employed for manufacturing TFTs for flat panel displays. However, in a conventional oxide transistor it is difficult to achieve a desired threshold voltage simultaneously with improved operational characteristics.

For example, a conventional oxide transistor generally uses an n-type oxide layer as the channel layer. To obtain improved operational characteristics including a high ON/OFF current ratio and a small subthreshold slope (SS), the carrier density and crystallinity of the n-type oxide layer may be increased and/or improved, resulting in increased and/or improved carrier mobility. Conversely, in order to obtain a desired threshold voltage, a reduced carrier density of the n-type oxide layer may be required and carrier mobility may be reduced. If the carrier density is reduced to obtain a desired threshold voltage, the ON/OFF current ratio may be reduced and the SS increased, thereby degrading the operational characteristics of the transistor. If the carrier density of the n-type oxide layer is increased to improve operational characteristics, the threshold voltage may become negative (−) and may prevent the manufacture of enhancement mode transistors.

SUMMARY

Example embodiments include semiconductor devices which may be tailored to have specific device characteristics, for example, mobility and threshold voltage.

Example embodiments include a semiconductor device having: a multi-layer channel including at least a first layer and a second layer; a source on the multi-layer channel, a drain on the multi-layer channel, separated from the source, and a gate on the multi-layer channel.

One of the first layer and the second layer may have a higher carrier mobility than the other layer and may include different oxide materials. The first layer and the second layer may have different carrier densities and may include different oxide materials. The first layer may be closer to the gate than the second layer. One of the first layer and the second layer may predominantly determine a mobility of the semiconductor device. At least one of the first layer and the second layer may predominantly determine a threshold voltage of the semiconductor device.

The first layer may have a higher carrier density than the second layer. The first layer may have a higher carrier mobility than the second layer. The first layer may primarily determine a mobility of the semiconductor device. If the thickness of the first layer, which is closer to the gate, is within a first range, a threshold voltage of the transistor may be predominantly determined by the second layer. If the thickness of the first layer is within a second range greater than the first range, the threshold voltage may be predominantly determined by the first and second layers. If the thickness of the first layer is within a third range greater than the second range, the threshold voltage may be predominantly determined by the first layer.

The first layer may include at least one oxide selected from the group consisting of an indium zinc oxide (IZO), an indium tin oxide (ITO), an aluminum zinc oxide (AZO) and a gallium zinc oxide (GZO). The second layer may include a ZnO based material. The first layer, may have a thickness of about 10 Å to about 500 Å. The first layer may have a thickness of about 30 Å to about 200 Å. The second layer may have a thickness of about 10 Å to about 2000 Å. The thickness of the second layer may be the same as or greater than the thickness of the first layer. The semiconductor device may be a thin film transistor (TFT) having a top gate or bottom gate structure.

BRIEF DESCRIPTION OF THE DRAWINGS

Example embodiments will be more clearly understood from the following brief description taken in conjunction with the accompanying drawings. FIGS. 1-11D represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. In the drawings, the thicknesses of layers and regions are exaggerated for clarity. Like reference numerals in the drawings denote like elements, and thus their description will be omitted.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
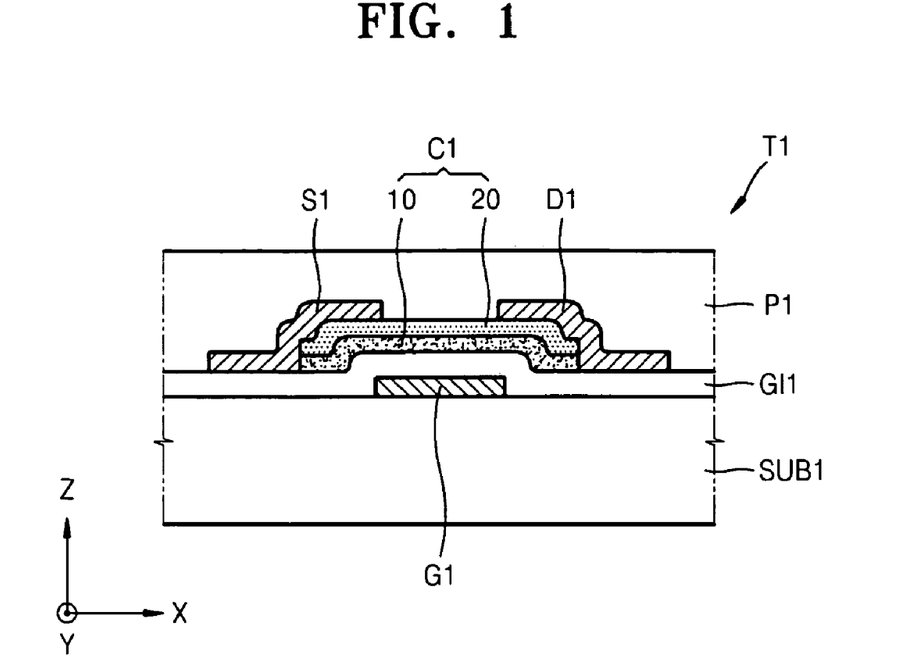
FIG. 1 is a cross-sectional diagram of a transistor according to an example embodiment.

FIG. 1 is a cross-sectional diagram of a transistor T1 according to an example embodiment. The transistor T1 may be a thin film transistor (TFT) which has, for example, a bottom gate structure, wherein a gate G1 may be below a channel layer C1. Referring to FIG. 1, the gate G1 may be on a substrate SUB1. The substrate SUB1 may be, for example, a silicon substrate, a glass substrate, and/or a plastic substrate. The substrate SUB1 may or may not be transparent. A gate insulating layer GI1 may be on the substrate SUB1 so as to cover the gate G1. The gate insulating layer GI1 may be, for example, a silicon oxide layer, a silicon nitride layer, or any other suitable material layer. The channel layer C1 may be on the gate insulating layer GI1 above the gate G1. The channel layer C1 may have a width in an X axis direction that is greater than the width of the gate G1 in the X axis direction.

The channel layer C1 may have a multi-layered structure including at least two layers (e.g., oxide layers) having different carrier mobilities and/or carrier densities. For example, the channel layer C1 may have a double-layered structure including a first layer 10 and a second layer 20 on the first layer 10. The first layer 10 may be closer to the gate G1 than the second layer 20. The mobility of charge carriers (hereinafter "carriers") in the first layer 10 may be greater than mobility of carriers in the second layer 20 and/or the carrier density of the first layer 10 may be greater than carrier density of the second layer 20.

The mobility of a field effect device (e.g., a transistor) may increase as carrier density and/or carrier mobility of a channel layer of the device increases. If the channel layer is an oxide, although carrier mobility and carrier density of a material are independent variables, carrier density is generally proportional to carrier mobility. For example, an oxide with high and/or increased carrier density may generally have high and/or increased carrier mobility, although exceptions may exist (e.g., an oxide may have high and/or increased carrier density but low and/or decreased mobility). In general, the greater the carrier mobility and/or carrier density of an oxide used as a channel, the greater the mobility of the transistor using the channel. However, a fast and/or improved transistor may result even if an oxide channel layer having low and/or decreased mobility and low and/or decreased carrier densities is used, because the oxide channel may have high and/or increased mobility when the carrier density of the oxide layer is increased.

Carrier density and/or carrier mobility of a channel material may influence not only the mobility of a field effect device, but also the threshold voltage. For example, the threshold voltage of a transistor may increase as the carrier density of the channel material decreases, shifting in a positive (+) direction. If the channel layer C1 includes first and second layers 10 and 20 having different carrier densities and/or carrier mobilities according to example embodiments, the mobility and threshold voltage of the transistor including the channel layer C1 may be controlled (e.g., tailored). In the case of an Si TFT, the threshold voltage may be controlled by boron or phosphor doping. In the case of an oxide TFT, the threshold voltage may be controlled by the oxide material. One or more deposition conditions of the oxide material, for example, deposition pressure and temperature, $O_2$ ratio, or composition of the channel layer may influence the properties of the oxide TFT. Also, the threshold voltage may be controlled by the gate insulator material and/or the gate insulator processes conditions.

The mobility of the transistor T1 may be influenced by the multi-layered channel layer. The first layer 10 may be closer to the gate G1 relative to the second layer 20. The transistor T1 including the first layer 10 and the second layer 20 of the channel layer C1 may have higher mobility than a transistor including a channel layer having only the material of the second layer 20, because the first layer 10 may have higher carrier density and/or carrier mobility than the second layer 20. Because the mobility of the transistor T1 may be influenced by either carrier mobility or carrier density, if the first layer 10 has lower carrier mobility, the mobility of the transistor T1 may increase due to the first layer 10 if the first layer 10 has high and/or increased carrier density. If the first layer 10 has low and/or decreased carrier density, the mobility of the transistor T1 may increase due to the first layer 10 if the first layer 10 has higher and/or increased carrier mobility.

The threshold voltage of the transistor T1 may be influenced by the multi-layered channel layer. The threshold voltage of the transistor T1 may be a function of the thickness of the first layer 10. If the first layer 10 is sufficiently thin, the threshold voltage of the transistor T1 may be determined primarily by the second layer 20 rather than by the first layer 10. For example, if the first layer 10 is sufficiently thin, the threshold voltage of the transistor T1 may be determined according to materials, compositions and carrier density of the second layer 20. Because the second layer 20 may have lower carrier density and/or carrier mobility than the first layer 10, the threshold voltage of the transistor T1 including the first layer 10 and the second layer 20 of the channel layer C1 may be increased and/or improved compared to that of a transistor including a channel layer having only the material of the first layer 10. The threshold voltage of the transistor T1 may be increased to operate in an enhancement mode (e.g., normally off) while having a high and/or increased mobility. The transistor T1 may have a positive (+) threshold voltage.

If the first layer 10 is not sufficiently thin (thicker than a desired and/or critical thickness), the influence of the first layer 10 on the threshold voltage of the transistor T1 may increase. As the influence of the first layer 10 on the threshold voltage of the transistor T1 increases, the threshold voltage of the transistor T1 may decrease and/or become negative (−). If the first layer 10 is too thick, the threshold voltage of the transistor T1 may be determined by the first layer 10 rather than the second layer 20.

The multi-layered channel layer may include any suitable material. For example, the first layer 10 may include at least one of indium, zinc, tin, aluminum, gallium, and oxygen. For example, the first layer 10 may be a layer including an indium zinc oxide (IZO), an indium tin oxide (ITO), an aluminum zinc oxide (AZO) and/or a gallium zinc oxide (GZO). The second layer 20 may include, for example, at least one of zinc, gallium, indium, and oxygen. The second layer 20 may include, for example, a ZnO-based material. The second layer 20 may include Group III elements such as Ga and In. For example, the second layer 20 may be a gallium indium zinc oxide (GIZO) layer. The second layer 20 may be a ZnO-based layer doped with Group IV elements such as Sn and/or another suitable element instead of Group III elements. However, example embodiments may be applied to a channel of different materials and is not limited to the examples herein.

The thickness of the first layer 10 may be about 10 Å to about 500 Å, for example, about 30 Å to about 200 Å. If the first layer 10 is too thin, the effect of the first layer 10 with regards to increasing the mobility of the transistor T1 may be reduced. If the first layer 10 is too thick, the effect of the second layer 20 with regards to increasing the threshold voltage of the transistor T1 may be reduced because a channel formed in the second layer 20 may be reduced. As the thickness of the first layer 10 increases, the threshold voltage of the transistor T1 may be influenced by both of the first and second layers 10 and 20. If the first layer 10 is too thick, the threshold voltage of the transistor T1 may be determined not by the second layer 20 but by the first layer 10. By varying the thickness of the first layer 10, the threshold voltage of the transistor T1 may be tailored to its purposes.

To increase the threshold voltage of the transistor T1 (e.g., shifting the threshold voltage to the positive (+) side), the thickness of the first layer 10 may be reduced so that the effect of the second layer 20 of increasing the threshold voltage may be increased. To decrease the threshold voltage of the transistor T1 (e.g., shifting the threshold voltage to the negative (−) side), the first layer 10 may be adjusted so that the effect of the second layer 20 of increasing the threshold voltage may be decreased and/or eliminated. The thickness of the first layer 10 may be about 10 Å to about 500 Å. For example, the thickness of the first layer 10 may be about 30 Å to about 200 Å. The thickness of the first layer 10, suitable to obtain the effect of the second layer 20 of adjusting the threshold voltage, may vary according to materials of the first and second layers 10 and 20. The thickness may also vary according to the size and type of the transistor. The thickness of the second layer 20 may be about 10 Å to about 2000 Å. The thickness of the second layer 20 may be, for example, equal to or greater than that of the first layer 10.

A source electrode S1 and a drain electrode D1 may be on the gate insulating layer GI1 so as to contact opposing sides of the channel layer C1. Each of the source electrode S1 and the drain electrode D1 may be, for example, a single metal layer or a multiple metal layer. The source electrode S1 and the drain electrode D1 may include the same or different materials as those included in the gate G1. A passivation layer P1 may be on the gate insulating layer GI1 and may cover the channel layer C1, the source electrode S1, and the drain electrode D1. The passivation layer P1 may be, for example, a silicon oxide layer or a silicon nitride layer. The gate G1 may have a thickness of, for example, about 50 nm to about 300 nm. The gate insulating layer GI1 may have a thickness of, for example, about 50 nm to about 300 nm. The source electrode S1 may have a thickness of, for example, about 10 nm to about 200 nm. The drain electrode D1 may have a thickness of, for example, about 10 nm to about 200 nm.

Figure 2:
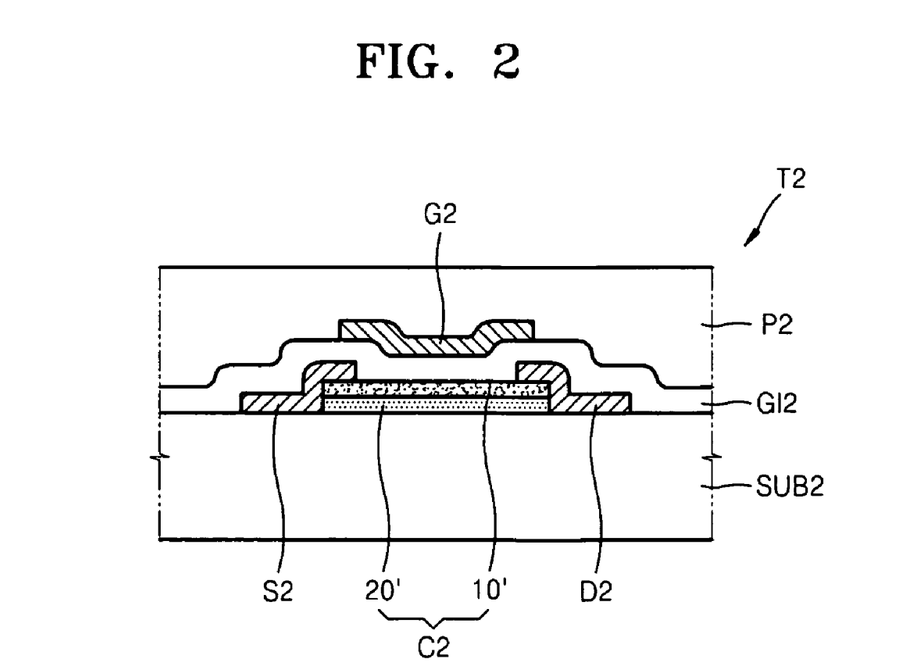
FIG. 2 is a cross-sectional diagram of a transistor according to an example embodiment.

FIG. 2 is a cross-sectional diagram of a transistor T2 according to an example embodiment. The transistor T2 may be a TFT which has a top gate structure, wherein a gate G2 may be on a channel layer C2. Referring to FIG. 2, the channel layer C2 may be on a substrate SUB2. The channel layer C2 may have a structure in which, for example, the channel layer C1 of FIG. 1 is turned over. The channel layer C2 of FIG. 2 may have a structure in which a first layer 10' corresponding to the first layer 10 of FIG. 1 is on a second layer 20' corresponding to the second layer 20 of FIG. 1, and the second layer 20' may be on the substrate SUB2. A source electrode S2 and a drain electrode D2 may be on the substrate SUB2 and may contact opposing sides of the channel layer C2. A gate insulating layer GI2 may be on the substrate SUB2 (e.g., covering the channel layer C2, the source electrode S2, and the drain electrode D2). A gate G2 may be on the gate insulating layer GI2. The gate G2 may be formed, for example, above the channel layer C2. The first layer 10' may be closer to the gate G2 relative to the second layer 20'. A passivation layer P2 may be on the gate insulating layer GI2 (e.g., covering the gate G2).

The materials of the substrate SUB2, the first layer 10', the second layer 20', the source electrode S2, the drain electrode D2, the gate insulating layer GI2, the gate G2, and the passivation layer P2 of FIG. 2 may be, for example, the same or similar to those of the substrate SUB1, the first layer 10, the second layer 20, the source electrode S1, the drain electrode D1, the gate insulating layer GI1, the gate G1, and the passivation layer P1 of FIG. 1, respectively. The thicknesses of the various elements of FIG. 2 may be, for example, the same or similar to the corresponding elements of FIG. 1. Functions of the first layer 10' and the second layer 20' of FIG. 2 may be, for example, the same or similar as those of the first layer 10 and the second layer 20 of FIG. 1.

Figure 3:
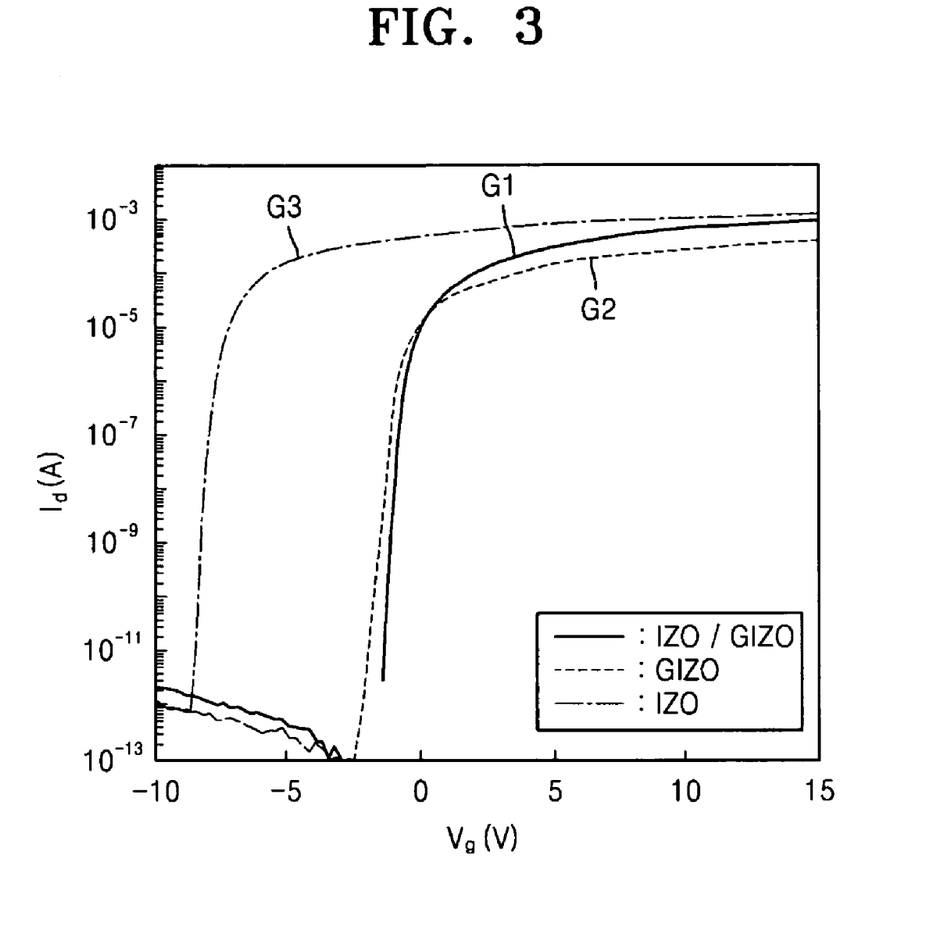
FIG. 3 is a semi-logarithmic graph of drain current ($I_d$) as a function of gate voltage ($V_g$) for an IZO/GIZO transistor according to an example embodiment and GIZO and IZO transistors that are comparative examples.

FIG. 3 is a semi-logarithmic graph of drain current ($I_d$) as a function of gate voltage ($V_g$) for an IZO/GIZO transistor according to an example embodiment and GIZO and IZO transistors that are comparative examples. A first graph G1 of FIG. 3 illustrates characteristics of a transistor according to an example embodiment (hereinafter, first transistor). For example, the first transistor may have the structure of FIG. 1, where the first layer 10 is an IZO layer and the second layer 20 is a GIZO layer. The IZO layer may have a thickness of about 50 Å and the GIZO layer may have a thickness of about 600 Å. A second graph G2 of FIG. 3 illustrates characteristics of a transistor according to a first comparative example, where the channel layer is a GIZO single layer having a thickness of about 600 Å. A third graph G3 of FIG. 3 illustrates characteristics of a transistor according to a second comparative example, where the channel layer is an IZO single layer having a thickness of about 500 Å. The drain voltage may be about 1 V in FIG. 3 and the same drain voltage may be used in order to obtain the graphs of FIGS. 5 and 7.

Comparing the first and second graphs G1 and G2 of FIG. 3, the ON current of the first graph G1 may be about $10^{-3}$ A, which may be about three times greater than the ON current (about $3 \times 10^{-4}$ A) of the second graph G2. Mobility of the first transistor may be about three times greater than that of the transistor according to the first comparative example. In example embodiments, the mobility of a TFT may be defined as the field effect mobility which illustrates a current driving property of the TFT according to gate and drain bias.

The mobility and a subthreshold slope (SS) of the transistors are shown in Table 1 below.

TABLE 1

| Channel layer | Mobility ($cm^2/V \cdot s$) | Subthreshold slope (V/dec) |
|---|---|---|
| IZO/GIZO double layer (example embodiment) | 52 | 0.19 |
| GIZO single layer (comparative example) | 19 | 0.19 |

Figure 4:
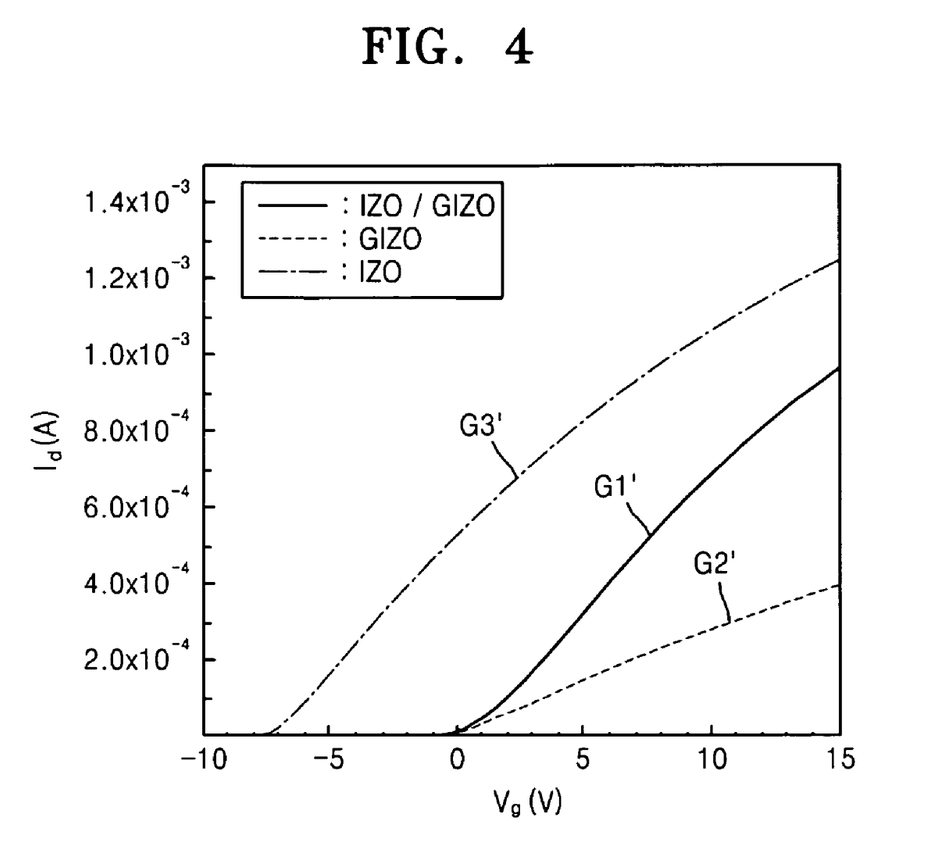
FIG. 4 is a linear scale graph of FIG. 3.

FIG. 4 is a linear scale graph of the first to third graphs G1-G3 of FIG. 3. The first to third graphs G1'-G3' of FIG. 4 correspond to the first to third graphs G1-G3 of FIG. 3, respectively. A gate voltage at a point where a tangent line of each of the first to third graphs G1 to G3' meets the X-axis may be a threshold voltage of the transistors. The tangent line is taken at a maximum 'Gm' point of the first to third graphs G1'-G3', wherein 'Gm' is [(variation of drain current)/(variation of gate voltage)], that is, [(delta Id)/(delta Vg)]. Referring to FIG. 4, the threshold voltage of the transistor of the first graph G1' may be about 0.31V and the threshold voltage of the transistor of the second graph G2' may be about −0.60V. The threshold voltage of the first transistor shown in the first graph G1' is similar to that of the transistor according to the first comparative example shown in the second graph G2'. The transistor of the third graph G3', which is a transistor including an IZO single layer as the channel layer, may have a low threshold voltage of about −8V. The transistor according to the second comparative example may not be an enhancement mode transistor and may be a depletion mode transistor.

As described above, while the first transistor has a positive (+) threshold voltage which is similar to a threshold voltage of the transistor according to the first comparative example, the transistor according to the second comparative example has a relatively low negative (−) threshold voltage. Because the first transistor includes an IZO/GIZO channel layer, the transistor according to the first comparative example includes a GIZO channel layer, and the transistor according to the second comparative example includes a IZO channel layer, the threshold voltage of the first transistor may be determined not by the IZO layer but by the GIZO layer.

A transistor according to example embodiments may be manufactured as an enhancement mode transistor with improved and/or increased mobility, as shown by FIG. 4. If the GIZO single layer is used as the channel layer of a transistor as in the first comparative example, the transistor may be manufactured as an enhancement mode transistor but may not have high and/or increased mobility. If the IZO single layer is used as the channel layer of a transistor as in the second comparative example, the transistor may have high and/or increased mobility but the threshold voltage may be so low that it may be difficult to manufacture an enhancement mode transistor. However, according to example embodiments, an enhancement mode transistor having high and/or increased mobility may be manufactured. The IZO layer of the IZO/GIZO channel layer of the first transistor according to an example embodiment may have a thin and/or decreased thickness of about 50 Å. In order to reduce a threshold voltage of the first transistor, the thickness of the IZO layer of the IZO/GIZO channel layer may be increased to increase the threshold voltage effect of the IZO layer.

Figure 5:
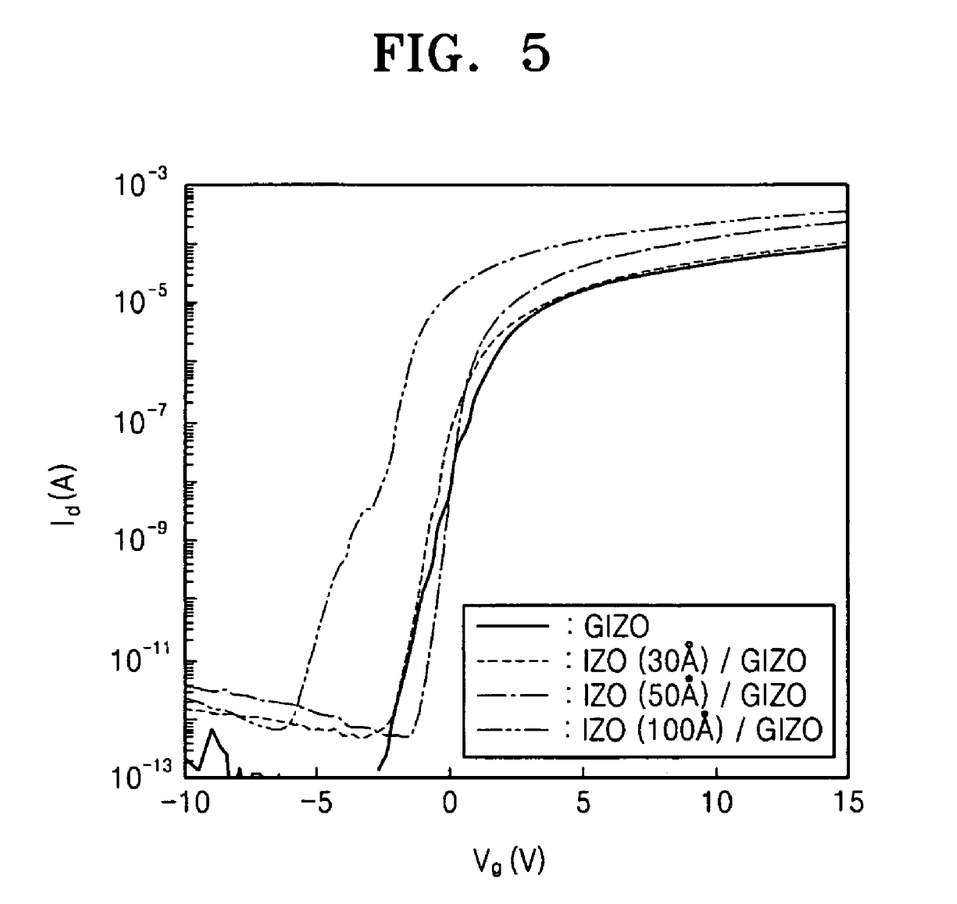
FIG. 5 is a semi-logarithmic graph of drain current ($I_d$) as a function of gate voltage ($V_g$) for IZO/GIZO transistors having different IZO channel layer thicknesses according to example embodiments and a GIZO transistor that is a comparative example.

FIG. 5 is a semi-logarithmic graph of drain current ($I_d$) as a function of gate voltage ($V_g$) for IZO/GIZO transistors having different IZO channel layer thicknesses according to example embodiments and a GIZO transistor that is a comparative example. The solid line in FIG. 5 indicates transistor characteristics of a transistor using a GIZO single layer without an IZO layer as the channel layer. The remaining lines indicate transistor characteristics of IZO/GIZO transistors with different IZO layer thicknesses according to example embodiments. The transistors according to IZO/GIZO example embodiments may include an IZO layer as a first layer 10 and a GIZO layer as a second layer 20. The thickness of the first layer 10 according to each IZO/GIZO example embodiment may be different.

Referring to FIG. 5, the transistor characteristics of the IZO/GIZO transistor including a thin and/or decreased IZO layer having a thickness of about 30 Å may be similar to the transistor characteristics of the transistor having the GIZO single layer. If the thickness of the IZO layer is increased to about 50 Å, the threshold voltage of the transistor may be similar to that of a transistor including a GIZO single layer, but the ON current may be increased. The increase in the ON current may indicate an increase in the mobility of the transistor. If the thickness of the IZO layer in the IZO/GIZO transistor is about 100 Å, the mobility of the transistor may be further increased in comparison to that of the IZO/GIZO transistor including the IZO layer having a thickness of 50 Å. However, the graph may move to the negative (−) side, indicating a negative threshold voltage.

The transistor characteristics of an IZO/GIZO transistor including an IZO layer that may be too thin may be similar to those of a transistor including the GIZO single layer as the channel layer. The characteristics of an IZO/GIZO transistor including an IZO layer that may be too thick may be similar to those of the transistor according to the second comparative example having an IZO single layer as the channel layer. The characteristics of an IZO/GIZO transistor including a tailored IZO layer may be manufactured as an enhancement mode transistor with increased and/or improved ON current. The thickness of the IZO layer may be tailored to its purpose.

Figure 6:
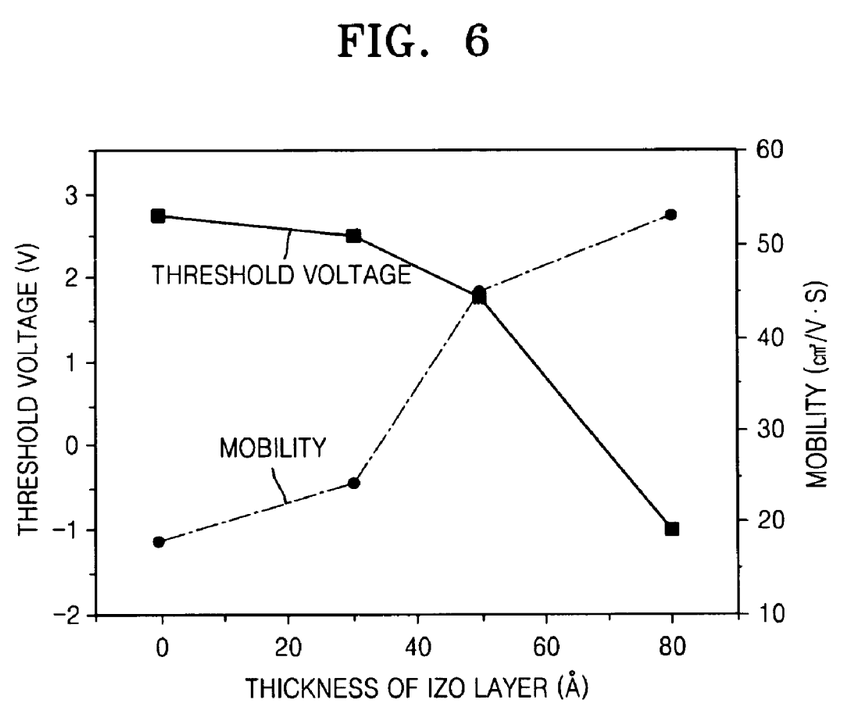
FIG. 6 is a graph of threshold voltage and mobility as a function of IZO channel layer thickness for IZO/GIZO transistors according to example embodiments.

FIG. 6 is a graph of threshold voltage and mobility as a function of IZO channel layer thickness for IZO/GIZO transistors according to example embodiments. Referring to FIG. 6, as the thickness of the IZO layer increases, the mobility may increase and the threshold voltage may decrease. When the thickness of the IZO layer is about 30 Å to about 50 Å, a variation in mobility may be maximized and/or improved. As the thickness of the IZO layer increases to greater than about 50 Å, a variation in threshold voltage may increase.

Figure 7:
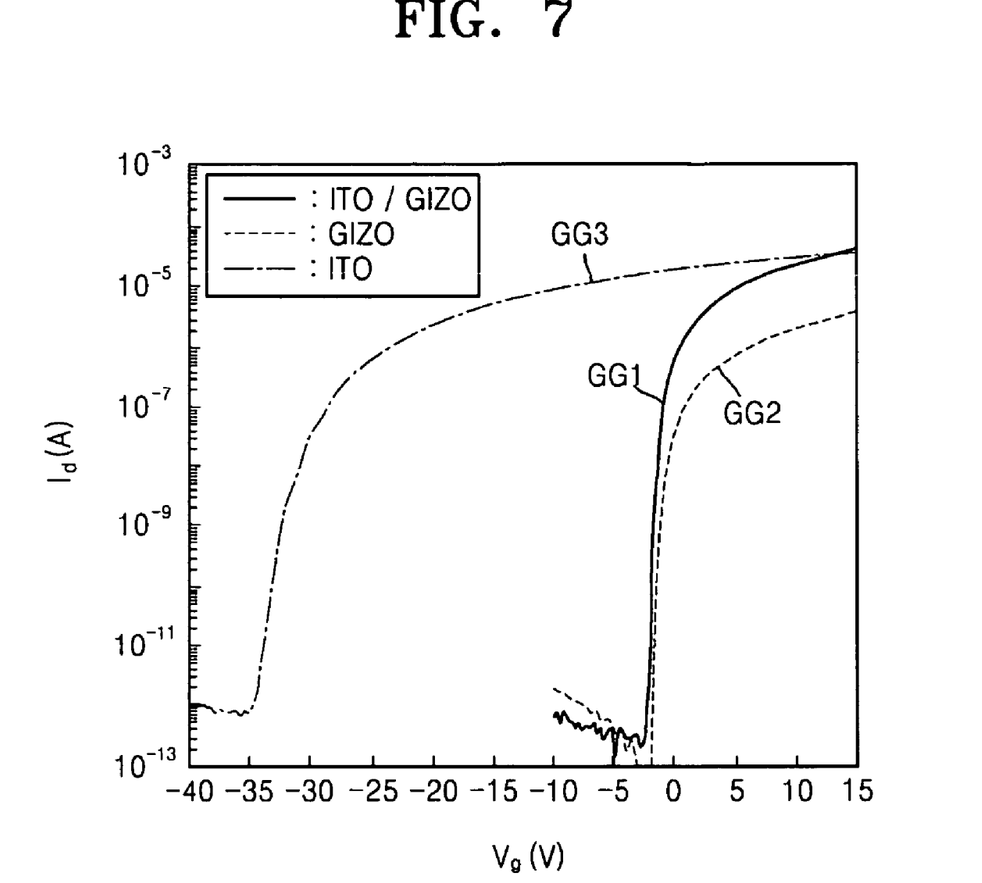
FIG. 7 is a semi-logarithmic graph of drain current ($I_d$) as a function of gate voltage ($V_g$) for an ITO/GIZO transistor according to an example embodiment and GIZO and ITO transistors that are comparative examples.

FIG. 7 is a semi-logarithmic graph of drain current ($I_d$) as a function of gate voltage ($V_g$) for an ITO/GIZO transistor according to an example embodiment and GIZO and ITO transistors that are comparative examples. A first graph GG1 of FIG. 7 illustrates characteristics of a transistor according to an example embodiment (hereinafter, second transistor). For example, the second transistor may be a transistor having the structure of FIG. 1, wherein the first layer 10 is an ITO layer and the second layer 20 is a GIZO layer. The ITO layer may have a thickness of about 50 Å. The GIZO layer may have a thickness of about 600 Å.

The second graph GG2 of FIG. 7 illustrates characteristics of a transistor according to a third comparative example, where the channel layer is a GIZO single layer having a thickness of about 600 Å. A third graph of GG3 of FIG. 7 illustrates characteristics of a transistor according to a fourth comparative example, where the channel layer is an ITO single layer having a thickness of about 50 Å. The transistor according to the third comparative example (GIZO single layer) may have a structure similar to that of the transistor according to the first comparative example described with reference to FIG. 3. However, conditions for forming the two transistors are slightly different.

Comparing the first and second graphs GG1 and GG2 of FIG. 7, the ON current of the first graph GG1 may be about $5 \times 10^{-5}$ A and the ON current of the second graph GG2 may be about $5 \times 10^{-6}$ A. The ON current of the first graph GG1 may be about ten times greater than the ON current of the second graph GG2. Mobility of the second transistor shown in the first graph GG1 may be about ten times greater than the mobility of the transistor according to the third comparative example shown in the second graph GG2.

A slope of a tangent line of the first graph GG1 at a turn-on point may be slightly greater than that of the second graph GG2 and the subthreshold slope (SS) of the second transistor may be less than that of the transistor according to the third comparative example. The turn-on speed of the second transistor including the double layered channel layer may be faster than that of the transistor including the single layered channel layer according to the third comparative example. The mobility, SS, and threshold voltage of the transistors are shown in Table 2 below.

TABLE 2

| Channel layer | Mobility ($cm^2/V \cdot s$) | Subthreshold slope (SS) (V/dec) | Threshold voltage (V) |
|---|---|---|---|
| ITO/GIZO double layer (example embodiment) | 104 | 0.25 | 0.50 |
| GIZO single layer (comparative embodiment) | 13 | 0.35 | 0.75 |

When a single oxide layer is used as the channel layer as in a conventional transistor, the carrier density of the channel layer may be decreased in order to increase the threshold voltage (e.g., so that the threshold is (+) positive), thereby decreasing the mobility of the transistor. However, according to example embodiments, a transistor having a desired threshold voltage, improved and/or increased mobility and/or improved SS characteristics may be manufactured using a double layered channel, for example, a channel layer having at least two oxide layers.

Figure 8:
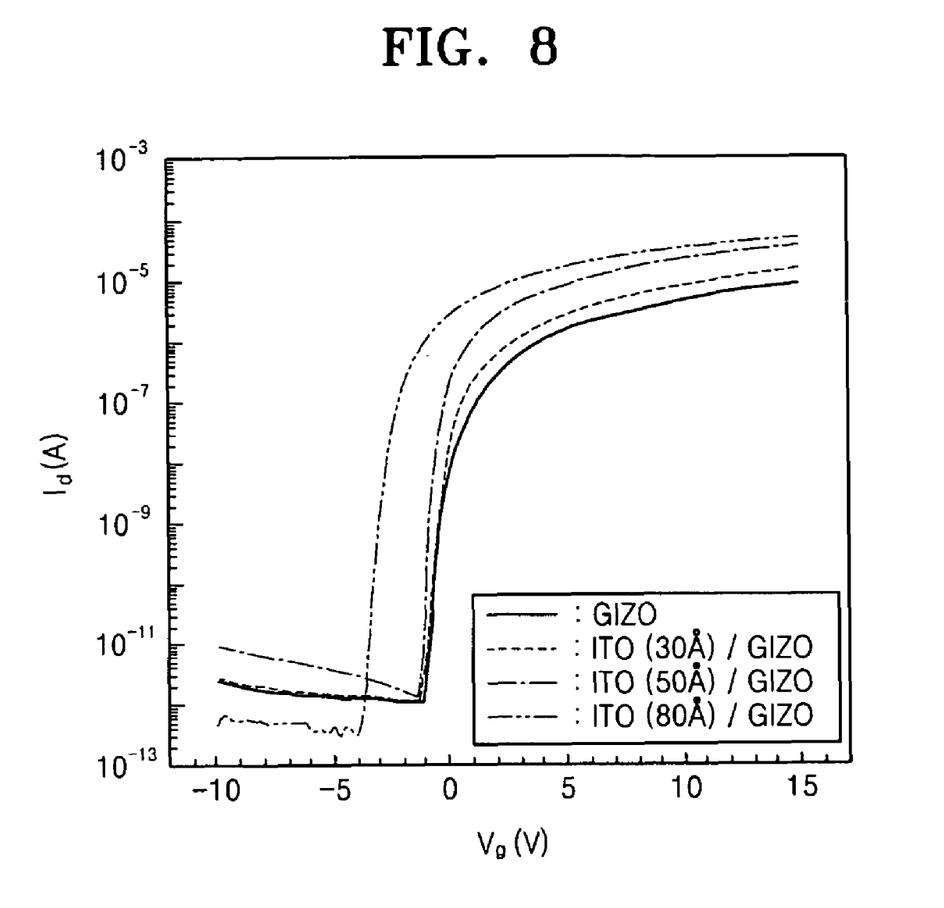
FIG. 8 is a semi-logarithmic graph of drain current ($I_d$) as a function of gate voltage ($V_g$) for ITO/GIZO transistors having different ITO channel layer thicknesses according to example embodiments and a GIZO transistor that is a comparative example.

FIG. 8 is a semi-logarithmic graph of drain current ($I_d$) as a function of gate voltage ($V_g$) for ITO/GIZO transistors having different ITO channel layer thicknesses according to example embodiments and a GIZO transistor that is a comparative example. The solid line in FIG. 8. indicates the characteristics of a transistor having a GIZO single layer without an ITO layer as the channel layer. The remaining lines indicate characteristics of transistors having ITO/GIZO channel layers with different ITO layer thicknesses according to example embodiments. The transistors according to ITO/GIZO example embodiments may include an ITO layer as a first layer 10 and a GIZO layer as a second layer 20. The thickness of the first layer 10 according to each ITO/GIZO example embodiment may be different.

The results of FIG. 8 may be similar to those of FIG. 5. The transistor characteristics of an ITO/GIZO transistor including a thin and/or decreased ITO layer having a thickness of about 30 Å may be similar to those of the transistor having a GIZO single layer, but ON current may be increased. The threshold voltage of an ITO/GIZO transistor including an ITO layer having a thickness of about 50 Å may be similar to that of the transistor having the GIZO single layer, but ON current may be further increased in comparison to that of the ITO/GIZO transistor including the ITO layer having a thickness of 30 Å. The increase in ON current may indicate an increase in the mobility of the transistor. If the thickness of the ITO layer in the ITO/GIZO transistor is about 80 Å, the mobility of the transistor may be further increased in comparison to that of the ITO/GIZO transistor including the ITO layer having a thickness of 50 Å. However, the graph may move to the negative (−) side, indicating a negative threshold voltage.

Figure 9:
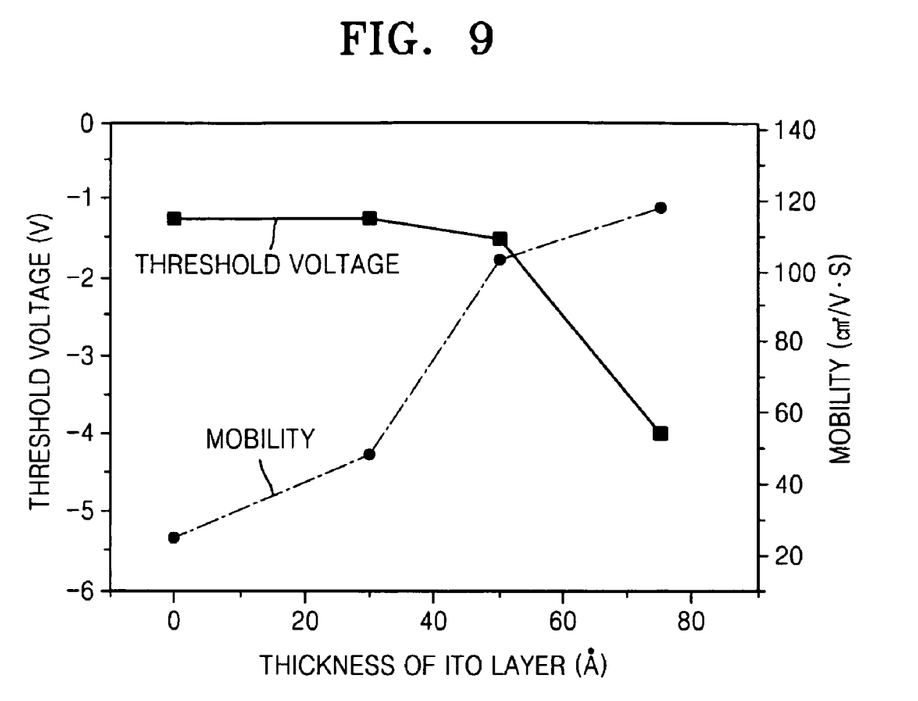
FIG. 9 is a graph of threshold voltage and mobility as a function of ITO channel layer thickness for ITO/GIZO transistors according to example embodiments.

FIG. 9 is a graph of threshold voltage and mobility as a function of ITO channel layer thickness for ITO/GIZO transistors according to example embodiments. Referring to FIG. 9, as the thickness of the ITO layer increases, the mobility may increase and the threshold voltage may decrease. In particular, when the thickness of the ITO layer is about 30 Å to 50 Å, a variation in mobility may be maximized and/or improved. As the thickness of the ITO layer increases to greater than about 50 Å, a variation in threshold voltage may increase.

Figure 10A:
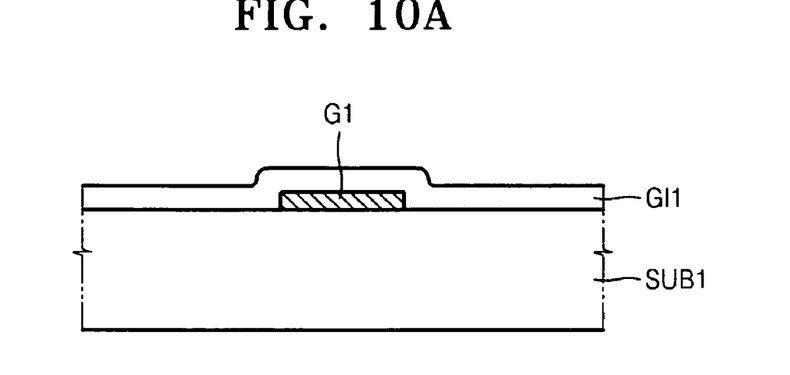
FIGS. 10A-10D are cross-sectional diagrams of a method of manufacturing a transistor according to an example embodiment.

FIGS. 10A-10D are cross-sectional diagrams of a method of manufacturing a transistor according to an example embodiment. The transistor according to the example embodiment may be a TFT having a bottom gate structure. The transistor manufactured according to FIGS. 10A-10D may correspond to the transistor of FIG. 1. Like reference numerals are used to indicate like elements. Referring to FIG. 10A, a gate G1 may be formed on a substrate SUB1. A gate insulating layer GI1 may be formed on the substrate SUB1 so as to cover the gate G1. The gate insulating layer GI1 may be formed of, for example, a silicon oxide, a silicon nitride, or other suitable materials.

Figure 10B:
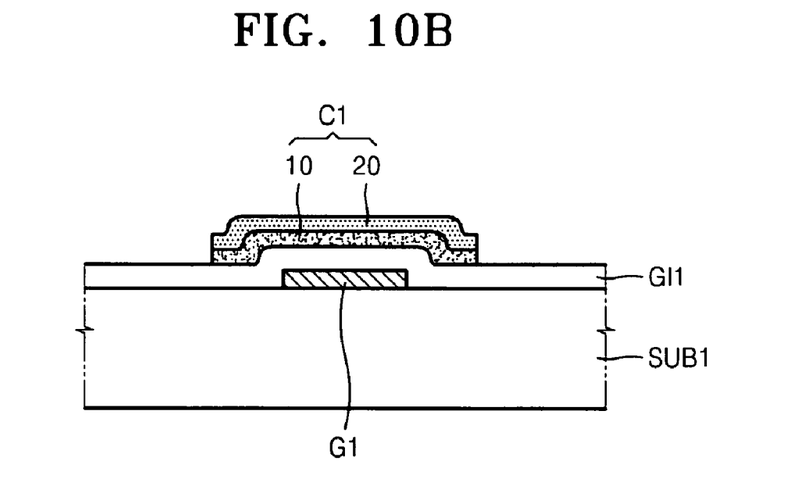
Figure 10C:
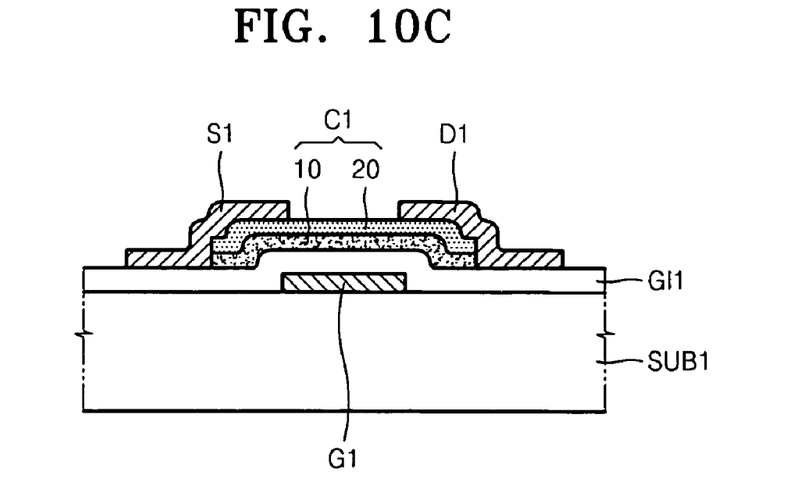
Figure 10D:
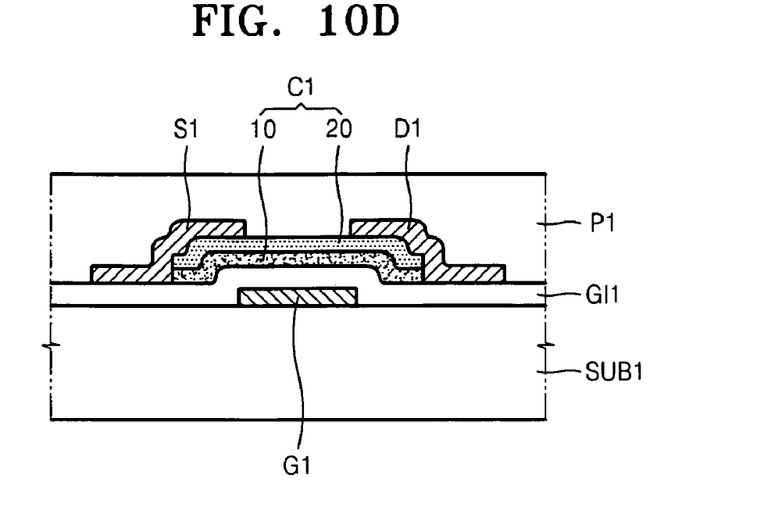

Referring to FIG. 10B, a channel layer C1 including a first layer 10 and a second layer 20 may be sequentially formed on the gate insulating layer GI1. The channel layer C1 may be positioned above the gate G1. The first layer 10 and the second layer 20 may be deposited using a physical vapor deposition (PVD) method (e.g., sputtering or evaporation) and/or may be patterned using the same mask layer. Referring to FIG. 10C, a source electrode S1 and a drain electrode D1 may be formed on the gate insulating layer GI1 so as to contact the opposing ends of the channel layer C1 while leaving a portion of an upper surface of the channel layer C1 exposed. The source electrode S1 and the drain electrode D1 may each be formed of a conductor, for example, a single metal layer or a multiple metal layer. Referring to FIG. 10D, a passivation layer P1 may be formed on the substrate SUB1 so as to cover the exposed portion of the channel layer C1, the source electrode S1, and the drain electrode D1. The resulting structure may be annealed at a temperature to achieve a transistor according to example embodiments.

Figure 11A:
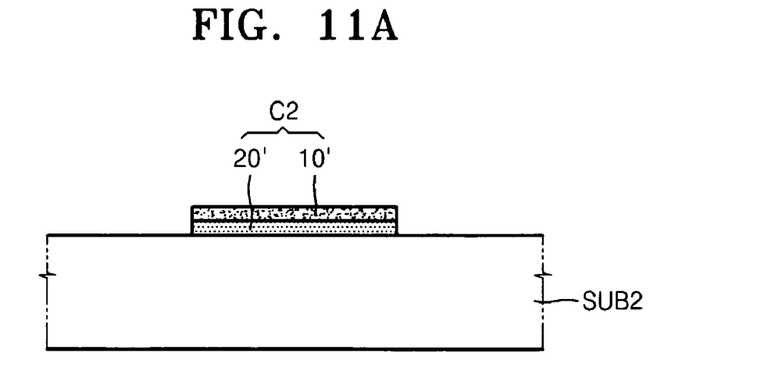
FIGS. 11A-11D are cross-sectional diagrams of a method of manufacturing a transistor according to an example embodiment.

FIGS. 11A-11D are cross-sectional diagrams of a method of manufacturing a transistor according to an example embodiment. The transistor may be a TFT having a top gate structure. The transistor manufactured according to FIGS. 11A-11D may correspond to the transistor of FIG. 2. Like reference numerals are used to indicate like elements. Referring to FIG. 11A, a channel layer C2 may be formed on a substrate SUB2. The channel layer C2 may have a double layered structure including a second layer 20' and a first layer 10' sequentially formed on the substrate SUB2. The method of forming the first layer 10' and the second layer 20' may be similar to the method of forming the first layer 10 and the second layer 20 of FIG. 10B.

Figure 11B:
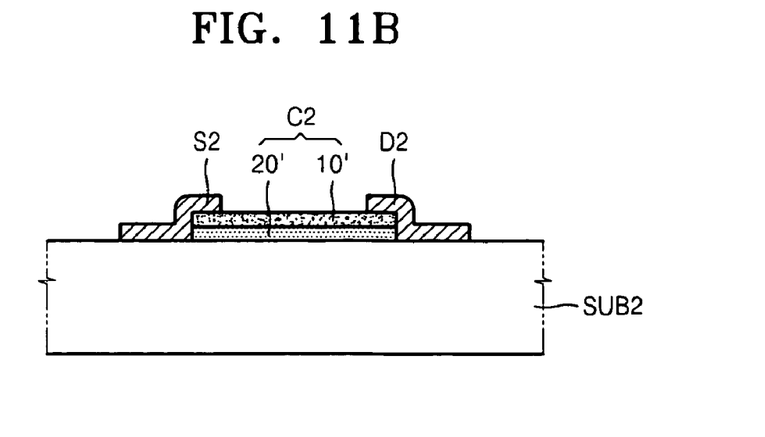
Figure 11C:
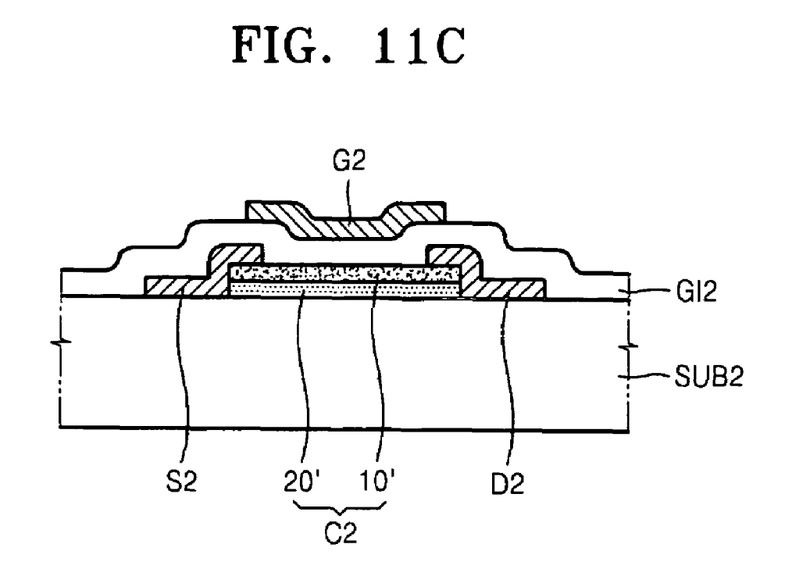

Referring to FIG. 11B, a source electrode S2 and a drain electrode D2 may be formed on the substrate SUB2 so as to contact the opposing ends of the channel layer C2. Referring to FIG. 11C, a gate insulating layer GI2 may be formed on the substrate SUB1 so as to cover the exposed portion of the channel layer C2, the source electrode S2, and the drain electrode D2. A gate G2 may be formed on the gate insulating layer GI2. The gate G2 may be positioned above the channel layer C2. The gate G2 may be formed of the same material (e.g., metal) used to form the source electrode S2 and drain electrode D2. Alternatively, the gate G2 may be formed of a different material from that used to form the source electrode S2 and drain electrode D2.

Figure 11D:
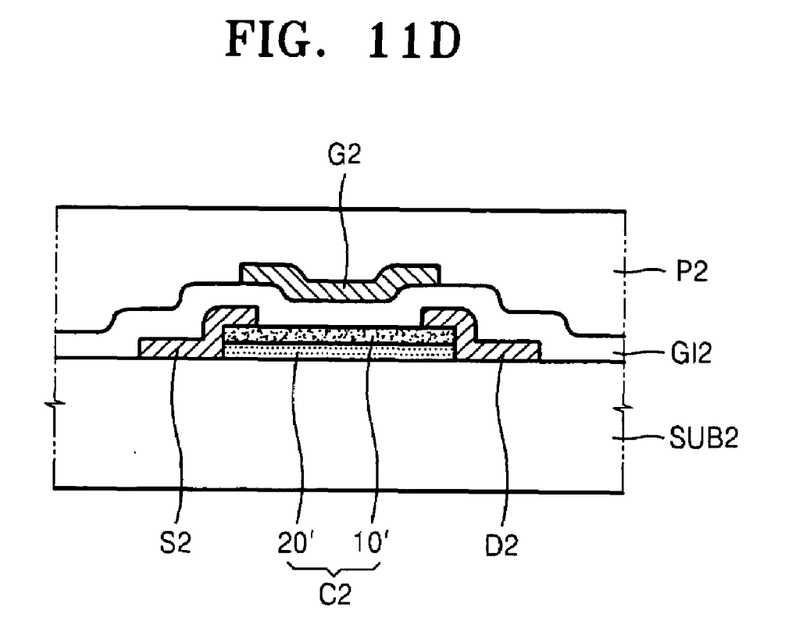

Referring to FIG. 11D, a passivation layer P2 may be formed on the gate insulating layer GI2 so as to cover the gate G2. The passivation layer P2 may be formed of, for example, a silicon oxide layer or a silicon nitride layer. The resulting structure may be annealed at a temperature to achieve a transistor according to example embodiments.

While example embodiments have been particularly shown and described with reference to the accompanying drawings, it will be understood by one of ordinary skill in the art that variations in form and detail may be made therein without departing from the spirit and scope of the claims. The scope of the present application should not be construed as being limited to example embodiments. For example, one of ordinary skill in the art would understand that the teachings herein may be applied to other devices besides TFTs. Example embodiments may, for example, include all devices including a channel (e.g., field effect devices).

The constituent elements and structures of the transistors of FIGS. 1 and 2 may be modified and may take various forms. The transistors according to example embodiments may not be enhancement mode transistors and may be depletion mode transistors. The channel layers may be used not only for liquid crystal display (LCD) apparatuses and organic light-emitting display apparatuses but also for memory devices and logic devices. The scope of the present application should not be interpreted as being limited to example embodiments.

While aspects of the present invention have been particularly shown and described with reference to differing embodiments thereof, it should be understood that these example embodiments should be considered in a descriptive sense only and not for purposes of limitation. Descriptions of features or aspects within each embodiment should typically be considered as available for other similar features or aspects in the remaining embodiments. Modifications as would be obvious to one of ordinary skill in the art are intended to be included within the scope of the following claims.

What is claimed is:

1. A semiconductor device, comprising:
   a multi-layer channel including at least a first layer and a second layer which have different carrier mobilities and formed of different oxide materials;
   a source on the multi-layer channel layer;
   a drain on the multi-layer channel layer, separated from the source; and
   a gate on the multi-layer channel layer,
   wherein one of the first layer and the second layer is closer to the gate, and
   a thickness of the one of the first layer and the second layer is about 30 Å to about 200 Å.

2. The semiconductor device of claim 1, wherein the first layer is closer to the gate than the second layer and the first layer has a higher carrier mobility than the second layer.

3. The semiconductor device of claim 1, wherein the first layer is closer to the gate than the second layer, and
   the first layer predominantly determines a mobility of the semiconductor device.

4. The semiconductor device of claim 1, wherein a threshold voltage of the semiconductor device is predominantly determined by a one of the first and second layers which is farther from the gate.

5. The semiconductor device of claim 1, wherein the first layer is closer to the gate than the second layer, and
   the first layer includes at least one oxide selected from the group consisting of indium zinc oxide (IZO), indium tin oxide (ITO), aluminum zinc oxide (AZO) and gallium zinc oxide (GZO).

6. The semiconductor device of claim 1, wherein the second layer includes a ZnO-based material.

7. The semiconductor device of claim 1, wherein the semiconductor device is one of a top gate thin film transistor (TFT) and a bottom gate thin film transistor (TFT).

8. A semiconductor device, comprising:
   a multi-layer channel including at least a first layer and a second layer which have different carrier densities and formed of different oxide materials;
   a source on the multi-layer channel layer;
   a drain on the multi-layer channel layer, separated from the source; and
   a gate on the multi-layer channel layer,
   wherein one of the first layer and the second layer is closer to the gate, and
   a thickness of the one of the first layer and the second layer is about 30 Å to about 200 Å.

9. The semiconductor device of claim 8, wherein the first layer is closer to the gate than the second layer and the first layer has a higher carrier density than the second layer.

10. The semiconductor device of claim 8, wherein the first layer and the second layer have different carrier mobilities.

11. The semiconductor device of claim 10, wherein the first layer is closer to the gate than the second layer,
    the first layer has a higher carrier mobility than the second layer, and
    the first layer predominantly determines a mobility of the semiconductor device.

12. The semiconductor device of claim 8, wherein the one of the first layer and the second layer, which is closer to the gate, determines a mobility of the semiconductor device.

13. The semiconductor device of claim 8, wherein a threshold voltage of the semiconductor device is predominantly determined by a one of the first layer and the second layer which is farther from the gate.

14. The semiconductor device of claim 8, wherein the first layer includes at least one oxide selected from the group consisting of indium zinc oxide (IZO), indium tin oxide (ITO), aluminum zinc oxide (AZO) and gallium zinc oxide (GZO).

15. The semiconductor device of claim 8, wherein the second layer includes a ZnO-based material.

16. The semiconductor device of claim 8, wherein the semiconductor device is one of a top gate thin film transistor (TFT) and a bottom gate thin film transistor (TFT).

17. A semiconductor device, comprising:
    a multi-layer channel including at least a first layer and a second layer which have different carrier mobilities and formed of different oxide materials;
    a source on the multi-layer channel layer;
    a drain on the multi-layer channel layer, separated from the source; and
    a gate on the multi-layer channel layer,
    wherein the first layer is closer to the gate than the second layer,
    the first layer includes at least one oxide selected from the group consisting of indium zinc oxide (IZO), indium tin oxide (ITO), aluminum zinc oxide (AZO) and gallium zinc oxide (GZO), and
    the second layer includes gallium indium zinc oxide (GIZO).

* * * * *